US006711722B1

(12) United States Patent
Parashkevov et al.

(10) Patent No.: US 6,711,722 B1
(45) Date of Patent: Mar. 23, 2004

(54) METHOD FOR DERIVING A FUNCTIONAL CIRCUIT DESCRIPTION

(75) Inventors: Atanas Nikolaev Parashkevov, SA (AU); Simon Thomas Jolly, SA (AU); Timothy David McDougall, SA (AU)

(73) Assignee: Motorola, Inc., Schaumburg, IL (US)

( * ) Notice: Subject to any disclaimer, the term of this patent is extended or adjusted under 35 U.S.C. 154(b) by 519 days.

(21) Appl. No.: 09/642,921

(22) Filed: Aug. 21, 2000

(51) Int. Cl.$^7$ .............................................. G06F 17/50
(52) U.S. Cl. .................. 716/3; 716/1; 716/2
(58) Field of Search ........................................ 716/1–3

(56) References Cited

U.S. PATENT DOCUMENTS 5,629,858 A * 5/1997 Kundu et al. .................. 716/1

OTHER PUBLICATIONS

R. Bryant, MOSSIM: A Switch–Level Simulator for MOS LSI, 18$^{th}$ Design Automation Conference, 18$^{th}$ Design Automation Conference, pp. 786–790, Jun. 1981.*
S. Jolly et al., Automated Equivalence Checking of Switch Level Circuits, Proceedings of the 39$^{th}$ Conference on Design Automation, pp. 299–304, Jun. 2002.*
C. Malley et al., Logic Verification Methodology for Power PC Microprocessors, 32$^{nd}$ ACM/IEEE Design Automation Conference pp. 234–240, Jan. 1995.*
D. Blaauw et al., Automatic Generation of Behavioral Models From Switch–Level Descriptions, 26$^{th}$ ACM/IEE Design Automation Conference, pp. 179–184, Jun. 1987.*
M. Boehner, LOGEX—An Automatic Logic Extractor from Transistor to Gate Level for CMOS Technology, Proceedings of the 25$^{th}$ IEEE/ACM Conference on Design Automation, pp. 517–522, Jun. 1988.*

M. Laurentin et al., DESB, A Functional Abstractor for CMOS VLSI Circuits, Proceedings of the Conference on European Desig Automation, pp. 22–27, Nov. 1992.*
C. Ryan et al., VHDL Switch–Level Fault Simulation, Proceedings of the Conference on European Design Automation, pp. 650–655, Sep. 1994.*
R.E. Bryant, Fujitsu Laboratories, Ltd.; "*Extraction of Gate Level Models from Transistor Circuits by Four–Valued Symbolic Analysis*"; in *Digest of Technical Papers of the IEEE International Conference on Computer–Aided Design,* (Santa Clara, Ca), IEEE, Nov. 1991.
R.E.Bryant, "Boolean Analysis of MOS Circuits", *IEEE transactions on Computer–Aided Design,* vol. 6, pp. 634–649, Jul. 1987.
A. Kuehlmann, A Srinlvassan, and DP La Potin; Verity—A Formal Verification Program for Custom CMOS Circuits; IBM T. J. Watson research Center, Yorktown Heights, NY; RC 19759 (87538) Aug. 28, 1994 Computer Science, 28 pages.

* cited by examiner

*Primary Examiner*—A. M. Thompson
(74) *Attorney, Agent, or Firm*—Daniel K. Nichols

(57) ABSTRACT

A method for deriving a functional circuit description that is independent of pre-charge node values, the functional circuit description IS a transformation of an initial structural circuit description having pre-chargeable nodes. The method includes identifying the pre-chargeable nodes in initial structural circuit description. The pre-chargeable nodes have a logic value that is dependent upon an associated pre-charge clock. Pre-charge nodes value associated with the pre-chargeable nodes are then determined and then the functional circuit description that is independent of pre-charge node values is derived.

7 Claims, 3 Drawing Sheets

— PRIOR ART —

| $U_{pchg}$ | $D_{pchg}$ | ADDITIONAL CONDITIONS | INTERPRETATION |
|---|---|---|---|
| $U_{pchg} = 1$ | $D_{pchg} \mathrel{!}= 1$ | NONE | PRE-CHARGED TO 1 |
| $U_{pchg} \mathrel{!}= 0$ | $D_{pchg} = 0$ | NONE | PRE-CHARGED TO 1 |
| $U_{pchg} = 0$ | $D_{pchg} \mathrel{!}= 0$ | NONE | PRE-CHARGED TO 0 |
| $U_{pchg} \mathrel{!}= 1$ | $D_{pchg} = 1$ | NONE | PRE-CHARGED TO 0 |
| $U_{pchg} \mathrel{!}= U$ | $D_{pchg} = D$ | $U_{pchg} = !D_{pchg}$ | PRE-CHARGED TO 1 |
| $U_{pchg} = U$ | $D_{pchg} \mathrel{!}= D$ | $U_{pchg} = !D_{pchg}$ | PRE-CHARGED TO 0 |
| $U_{pchg} \mathrel{!}= U$ | $D_{pchg} \mathrel{!}= D$ | $U_{pchg} = !D_{pchg}$ AND THE STRONGEST DRIVING PATH OF TRANSISTORS IS A PULL-UP PATH | PRE-CHARGED TO 0 |
| $U_{pchg} \mathrel{!}= U$ | $D_{pchg} \mathrel{!}= D$ | $U_{pchg} = !D_{pchg}$ STRONGEST DRIVING PATH IS PULL-DOWN | PRE-CHARGED TO 1 |
| OTHERWISE | | | NO PRE-CHARGE |

*FIG. 3*

METHOD FOR DERIVING A FUNCTIONAL CIRCUIT DESCRIPTION

FIELD OF THE INVENTION

This invention relates to a method for deriving a functional circuit description from a structural circuit description, containing pre-charge logic, dependent upon pre-charge node values. The functional circuit description is independent of pre-charge node values. Accordingly, the invention is particularly useful for, but not necessarily limited to, translating the initial circuit description into a higher level behavioural circuit description that is independent of pre-charge node values.

BACKGROUND ART

Contemporary chip design depends critically on the availability of appropriate CAD tools in order to keep up with the ever increasing chip complexity. Designers typically work with chip descriptions at several levels of abstraction. The Register-Transfer Level (RTL) describes a circuit at the high level of Boolean functions and data flow within the circuit much like a regular programming language does. Gate-level descriptions provide a structural (schematic) description of a circuit as an interconnection of gates having a known and relatively simple Boolean behaviour. Switch-level descriptions represent the lowest level of circuit design abstraction. Switch-level descriptions are also structural (schematic) and contain an interconnection of switches (transistors) that implement the desired functionality of the circuit.

The RTL is often the preferred abstraction level for most design activities, however, any RTL design has to be translated into an equivalent switch-level design as a necessary step prior to chip fabrication. This translation can be performed using synthesis Electronic Design Automation (EDA) tools that compile RTL designs into a predefined technology-specific gate-level cell library containing a switch-level schematic for each cell. In some cases, especially when a chip has to meet stringent operating requirements (speed, power consumption, etc.), certain blocks of the chip may be designed at the switch level.

For a number of reasons, it is highly desirable and advantageous to accurately translate the functionality implemented by a circuit description containing switches into a higher level (gate or RTL). This is useful for formal functional verification to ensure that a chip operates as expected based on appropriate mathematical models. Unlike traditional functional verification approaches, such as simulation, formal verification provides 100% coverage of a circuit's functionality. To enable formal functional verification at a mixed (switch and gate) level, a method is required to translate the structural description of a circuit into a functional (Boolean) description in the corresponding mathematical model. Other application areas for mixed (switch and gate) level circuit analysis and translation include technology-specific library characterization, Automatic Test Pattern Generation (ATPG), and re-synthesis and re-design of chips from one chip manufacturing technology to another.

A family of mixed (switch and gate) level structures that utilise pre-charge logic (including dynamic, domino and non-footed pre-charge logic and various pre-charge clock tree and level restoring logic schemes) are particular difficult to analyse. Such circuits exploit their inherent dynamic characteristics in order to simultaneously increase operational speed and reduce circuit power consumption. The unique features of pre-charge logic circuits include a dependence on pre-charge clock inputs and a reliance on some form of net capacitance or level restoring logic at certain nodes in the circuit, named pre-charge nodes.

One aspect in deriving a functional model of a mixed (switch and gate) level circuit is the ability to identify and properly characterise the behaviour induced at pre-charge nodes by the introduction of pre-charge clock inputs. Various techniques have been developed for the analysis of the behaviour of mixed (switch and gate) level circuits. However, these techniques are based on a static switch-level model that ignores pre-charge clock inputs and the consequent dynamic or transient signal behaviour at pre-charge nodes. Therefore, they are unable to automatically model the dynamic behaviour at pre-charge nodes or subsequently produce an accurate functional description of that behaviour.

Tools known as ANAMOS and TRANALYZE, described in "Boolean Analysis of MOS Circuits" by R. E. Bryant published in IEEE TCAD, 6(4), pp. 634–649, July 1987, and later refined in "Extraction of Gate-Level Models from Transistor Circuits by Four-Valued Symbolic Analysis" also by R. E. Bryant and published in ICCAD '91, do not give special treatment to pre-charge clock inputs or pre-charge nodes. The ANAMOS and TRANALYZE tools were developed for transistor-level simulation and mapping into a hardware-based gate-level simulator. These tools use dynamic behaviour at pre-charge nodes is modelled during the simulation step rather than during transistor-level extraction.

Another approach to mixed (gate and switch) level circuit analysis has been implemented in a tool developed by International Business Machines Corporation. This tool is described in "Verity—a Formal Verification Program for Custom CMOS Circuits" by A. Kuehlmann, A. Srinivasan and D. P. LaPotin published in the IBM R & D Journal, Vol. 39, pp. 149–165, January—March 1995. This tool is a logic checker working at the switch level. The tool does not provide an equivalent higher-level model. It does give special treatment to pre-charge nodes, however the technique requires the user to specify the location of all pre-charge nodes to the tool.

In this specification, including the claims, the terms "comprises", "comprising" or similar terms are intended to mean a non-exclusive inclusion, such that a method or apparatus that comprises a list of elements does not include those elements solely, but may well include other elements not listed.

SUMMARY OF THE INVENTION

According to one aspect of the invention there is provided a method for deriving a functional circuit description that is independent of pre-charge node values, the functional circuit description being a transformation of an initial structural circuit description having pre-chargeable nodes, the method comprising the steps of:

identifying said pre-chargeable nodes in said initial structural circuit description, said pre-chargeable nodes having a logic value that is dependent upon an associated pre-charge clock;

determining said pre-charge node values associated with said pre-chargeable nodes;

deriving said functional circuit description that is independent of pre-charge node values.

Suitably, after the step of deriving, there may be a further step of translating the said functional circuit description into a hardware description language representation.

Suitably, the step of translating may include the step of applying a constant logic value to each internal pre-charge clock in the transformed circuit description.

Preferably, the step of translating may include the step of providing the pre-charge clock as part of the hardware description language representation.

Suitably, the step of identifying may be effected automatically.

Preferably, the step of identifying may include identifying nodes that are floating during part of a pre-charge clock cycle, these nodes being pre-charge nodes.

Suitably, the step of determining may include heuristic assessment of logic pull up and logic pull down conditions associated with each pre-charge node.

BRIEF DESCRIPTION OF THE DRAWINGS

In order that the invention may be readily understood and put into practical effect, reference will now be made to a preferred embodiment as illustrated with reference to the accompanying drawings in which:

FIG. 3 contains a table that describes a heuristic that is used to determine whether a channel connected component output node is pre-charged high or pre-charged low.

DETAILED DESCRIPTION OF THE PREFERRED EMBODIMENT OF THE INVENTION

Figure 1:
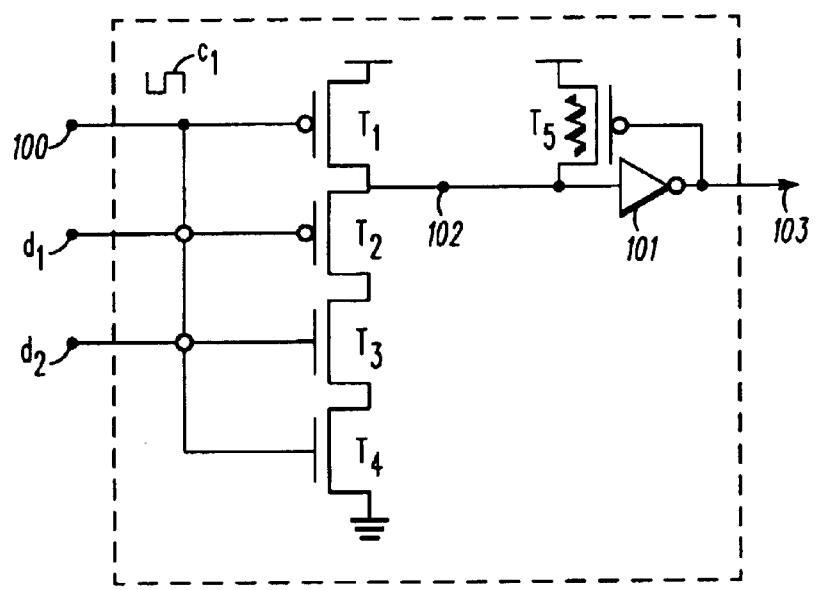
FIG. 1 is an example circuit having a pre-chargeable node.

The operation of pre-charge logic circuits is briefly described with reference to the example illustrated in FIG. 1. The distinguishing feature of pre-charge logic is the presence of a pre-charge clock illustrated as pre-charge clock C1 applied to a pre-charge clock input node 100. This circuit also includes a pre-charge node 102, output node 103, data input nodes $d_1$ and $d_2$, series coupled transistor switches $T_1$ to $T_4$, and level restoring logic including a NOT gate 101 and pull-up transistor $T_5$.

The pre-charge logic operates in two phases: the pre-charge phase is followed by an evaluate phase. The pre-charge clock input node 100 governs the alternation between these two phases. During the pre-charge phase the pre-charge clock C1 at pre-charge clock input node 100 is low and the pre-charge node 102 is always driven (pre-charged) high. During the evaluate phase the pre-charge clock C1 at pre-charge clock input node 100 is high and the pre-charge node 102 is conditionally discharged. If data input nodes $d_1$ and $d_2$ are both high, pre-charge node 102 is discharged and driven low. If either of data input nodes $d_1$ or $d_2$ are low, the charge at pre-charge node 102 is held by the level restoring logic 102, and the value at pre-charge node 102 remains high.

In the remainder of this specification, the following applies: Boolean function names start with an upper-case letter, e.g. $F_0$, $X_1$, $Z_1$; Boolean variable names start with a lower-case letter, (e.g. $v_0$, $v_1$); Boolean negation is denoted by the operator '!'; Boolean conjunction is denoted by the operator '&'; and Boolean disjunction is denoted by the operator '|'.

The example circuit is typically represented by a circuit model composed of sets of interconnected circuit input nodes, circuit output nodes, intermediate nodes, switches and gates with a predefined behaviour. Such a circuit model, for example, may be defined using a switch-level language as will be apparent to a person skilled in the art. The input model includes the identification of circuit input nodes that are pre-charge clocks and the pre-charge clock waveform that is applied to these nodes.

For clarification and ease of explanation in this specification, each circuit input i is associated with a Boolean variable is. Furthermore, it is assumed that a circuit being analysed has already been split into its constituent channel connected components (CCC) using known graph-based techniques. One such graph-based technique is described in "Boolean Analysis of MOS Circuits" by R. E. Bryant published in IEEE TCAD, 6(4), pp. 634–649, July 1987 and is incorporated into this specification by reference. All CCC input and output nodes are also presumed identified graph-based techniques. A CCC may contain a pre-charged output node if it has one or more CCC input nodes that are pre-charge clocks. A CCC pre-charged clock input is either a circuit input that is designated as such by the user and associated with a clock waveform; or a CCC input that is identified as a pre-charged clock by a later step in this algorithm.

Figure 2:
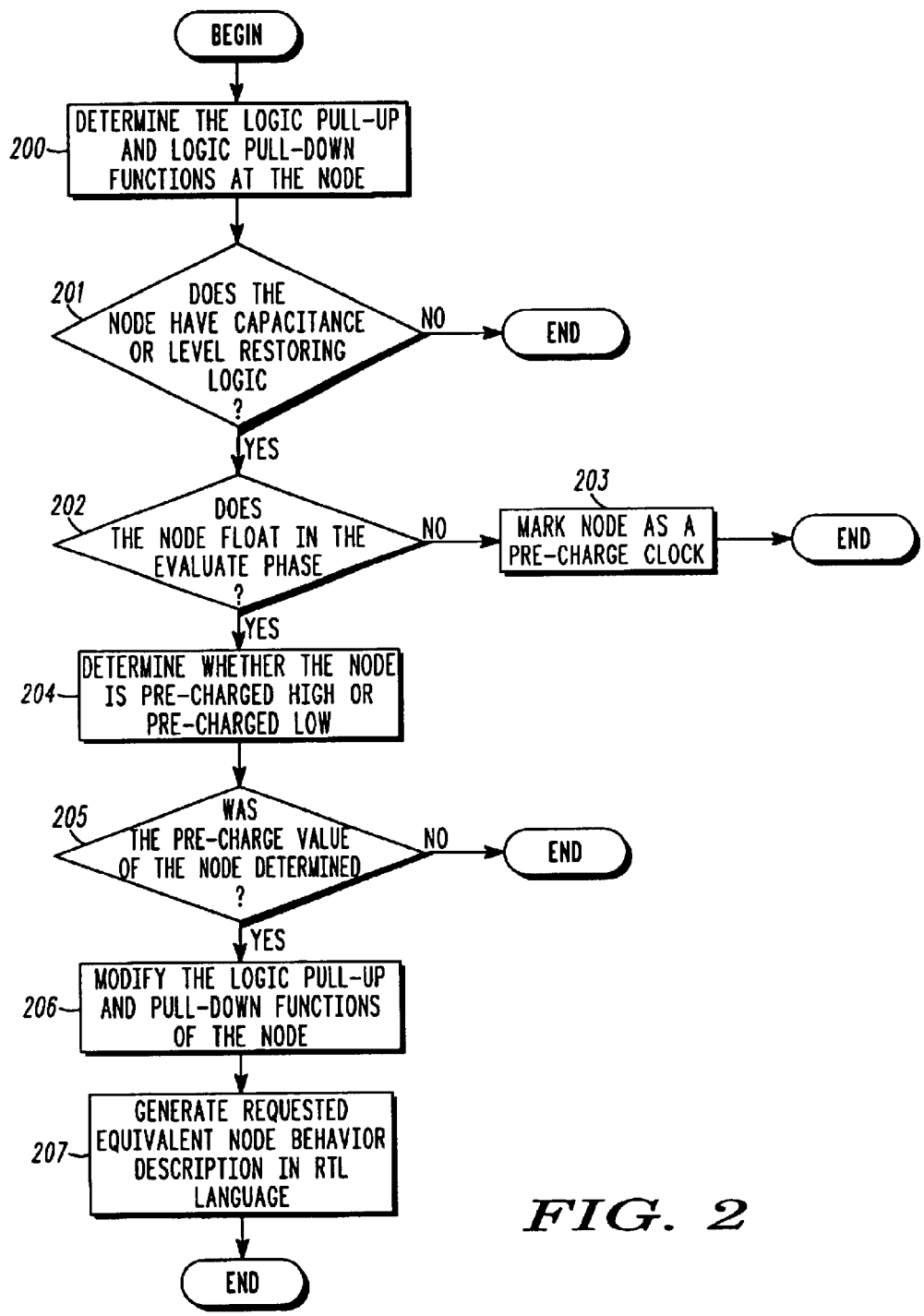
FIG. 2 shows a flow chart illustrating a method of deriving a functional circuit description in accordance with the invention.

Referring to FIG. 2, there is illustrated a method for deriving a functional circuit description. The method is called in turn on each CCC output of an initial structural circuit description. In step 200, a known technique (for example explicit path enumeration within the CCC) is used to obtain the logic pull-up function U and pull-down function D at a selected CCC output. Pull-up and pull-down functions U and D are expressed as functions of Boolean variables $i_f$ assigned to the circuit input nodes.

In step 201, pull-up and pull-down functions U and D are analysed to determine whether level restoring logic or a capacitance is attached to the CCC output node. The details of this analysis are described in U.S. Patent specification identified by patent application Ser. No. 09/393988 which is incorporated into this specification by reference. If there is no level restoring logic nor a capacitance attached to this CCC output node then the method ends. Otherwise, step 202 is effected.

At step 202, pre-chargeable nodes are identified from the initial structural circuit description. The pre-chargeable nodes having a logic value that is dependent upon an associated pre-charge clock. The pull-up and pull-down functions U and D are analysed to determine whether it is possible for the selected CCC output node to float during the evaluate phase of the pre-charge clock. The selected CCC output node is said to float when it is not driven by any part of the circuit (excluding level restoring logic). The actual (constant) values that are applied to the pre-charge clock circuit inputs during the evaluate phase are substituted into pull-up and pull-down functions U and D using known Boolean function manipulation techniques to derive Boolean functions $U_{eval}$ and $D_{eval}$, where:

$U_{eval}$=U.Substitute(clocks in evaluate phase); and $D_{eval}$=D.Substitute(clocks in evaluate phase).

If the disjunction of Boolean functions $U_{eval}$ and $D_{eval}$ ($U_{eval}$|$D_{eval}$) is not a constant 1 (tautology), then it is possible for the selected CCC output node to float during the evaluate phase of the pre-charge clocking scheme and therefore step 204 is effected. Otherwise, the algorithm proceeds to step 203.

In step 203, the CCC output node is automatically marked as a pre-charge clock, and the algorithm is terminated.

In step 204, the pre-charge node values associated with the pre-chargeable node are determined. The pull-up and pull-down functions U and D are analysed to determine whether the selected CCC output node is pre-charged high or pre-charged low. The actual (constant) values that are applied to the pre-charge clock circuit inputs during the pre-charge phase are substituted into the pull-up and pull-down functions U and D, where:

$U_{pchg}$=U.Substitute(clocks in pre-charge phase); and $D^{pchg}$=D.Substitute(clocks in pre-charge phase)

Boolean functions $U_{pchg}$ and $D_{pchg}$ are subsequently interpreted according a heuristic, that is illustrated in a table shown in FIG. 3, in order to determine whether the selected CCC output node is pre-charged high or pre-charged low. Each row in the table defines a test that is performed on Boolean functions $U_{pchg}$ and $D_{pchg}$, which are performed in series from the first row down. If a test successfully identifies that the CCC output node is pre-charged high or low, then the algorithm proceeds to step 205.

In step 205, the algorithm is terminated if none of the tests executed in step 204 determined the pre-charge value of the CCC output node. Otherwise, the algorithm proceeds to step 206.

In step 206, a functional circuit description that is independent of pre-charge node values containing Boolean functions $U_{modified}$ and $D_{modified}$ is derived. These are modified logic pull-up and logic pull-down functions that absorb the pre-charged behaviour, and thereby capture the static behaviour of the circuit in a pair of complimentary functions. If step 204 determined that the selected CCC output node was pre-charged high, Boolean functions $U_{modified}$ and $D_{modified}$ are calculated whereby: $U_{modified}$=U |!D; and $D_{modified}$=!U & D.

If step 204 determined that the selected CCC output node was pre-charged low, Boolean functions $U_{modified}$ and $D_{modified}$ are calculated whereby: $D_{modified}$=D |!U; and $U_{modified}$=!D & U.

In step 206, Boolean functions $U_{output}$ and $D_{output}$ are calculated. If the required output language representation should model the behaviour of the circuit in both the pre-charge and evaluate phases of pre-charge clock, then $U_{output}$=$U_{modified}$ and $D_{output}$=$D_{modified}$. An alternative is for the output language representation to model the behaviour of the circuit without referring to pre-charge clocks. This results in the production of an equivalent static combinational representation. In this case, $U_{output}$ and $D_{output}$ are calculated whereby: $U_{output}$=$U_{modified}$. Substitute(clocks in evaluate phase); and $D_{output}$=$D_{modified}$. Substitute(clocks in evaluate phase)

In step 207, Boolean functions $U_{output}$ and $D_{output}$ are translated into an RTL representation in a hardware description language. As an example of the output only, we present the equivalent RTL statement as follows:

assign <selected CCC output name>=$U_{output}$.

Referring back to the example circuit of FIG. 1, the invention derives a functional circuit description as follows. The example circuit is a simple mixed (switch and gate) level pre-charged logic circuit that implements an AND gate. The AND gate has two data input nodes d1 and d2 and a single pre-charge clock input node 100. The pre-charge clock C1 waveform applied at node 100 is low in the pre-charge phase, and high in the evaluate phase. This circuit has two CCCs, one containing transistors $T_1$ to $T_5$ in the circuit, the other containing a single NOT gate.

In steps 200 and 201, the output of the first CCC at node 102 is evaluated. During this analysis, the level-restoring logic is taken into account, thereby producing the logic pull-up U and logic pull-down D functions at node 102 as follows:

$U$=!$c_1$ $D$=$d_1$ & $d_2$ & $c_1$

In step 202, Boolean functions $U_{eval}$ and $D_{eval}$ are computed by substituting the value of the pre-charge clock C1 in the evaluate phase into pull-up and pull-down functions U and D. The disjunction of these two results is then formed whereby:

$U_{eval}$=0;

$D_{eval}$=$d_1$ & $d_2$; and ($U_{eval}$|$D_{eval}$)=$d_1$ & $d_2$.

Since $U_{eval}$ |$D_{eval}$ is not a tautology, the CCC output at node 102 may float under some input conditions in the evaluate phase (i.e. when $d_1$=0 or $d_2$=0). Since the CCC output at node 102 floats in the evaluate phase the method proceeds to step 204.

In step 204, $U_{pchg}$ and $D_{pchg}$ are computed by substituting the value of the pre-charge clock in the pre-charge phase into U and D. The two results are analysed according to the table in FIG. 3 such that:

$U_{pchg}$=1; and $D_{pchg}$=0.

By analysis of the heuristic table of FIG. 3, the CCC output node 102 is pre-charged high. Thus, the method proceeds to step 206.

In step 206, the modified logic pull-up and logic pull-down functions are computed as follows:

$U_{modified}$=(U |!D)=(!$c_1$ |!$i_1$ |!$i_2$)

$D_{modified}$=(!$U_{modified}$)=($c_1$ & $i_1$ & $i_2$)

In step 207 an output is generated in the targeted RTL hardware description language. As an example of the output a typical RTL statement would be provided as follows:

assign 102=!($c_1$ & $i_1$ & $i_2$).

The present invention advantageously derives a functional circuit description that is independent of pre-charge node values by identifying pre-chargeable nodes in an initial circuit description.

Although the invention has been described with reference to a preferred embodiment it is to be understood that the invention is not restricted to the particular embodiment described herein.

We claim:

1. A method for deriving a functional circuit description that is independent of pre-charge node values, the functional circuit description being a transformation of an initial structural circuit description having pre-chargeable nodes, the method comprising the steps of:

identifying said pre-chargeable nodes in said initial structural circuit description, said pre-chargeable nodes having logic values that are dependent upon an associated pre-charge clock;

determining said pre-charge node values associated with said pre-chargeable nodes;

deriving said functional circuit description that is independent of pre-charge node values.

2. The method of claim 1, wherein, after the step of deriving, there is a further step of translating the said functional circuit description into a hardware description language representation.

3. The method of claim 2, wherein the step of translating includes the step of applying a constant logic value to each internal pre-charge clock in the transformed circuit description.

4. The method of claim 2, wherein the step of translating includes the step of providing the pre-charge clock as part of the hardware description language representation.

5. The method of claim 1, wherein the step of identifying is effected automatically.

6. The method of claim 5, wherein the step of identifying includes identifying nodes that are floating during part of a pre-charge clock cycle, these nodes being pre-charge nodes.

7. The method of claim 1, wherein the step of determining includes heuristic assessment of logic pull up and logic pull down conditions associated with each pre-charge node.

* * * * *